United States Patent [19]
Saitou

[11] Patent Number: 5,052,103
[45] Date of Patent: Oct. 1, 1991

[54] METHOD OF MANUFACTURING PRINTED WIRING BOARD HAVING NO COPPER MIGRATION

[75] Inventor: Hideo Saitou, Osaka, Japan

[73] Assignee: Sharp Kabushiki Kaisha, Osaka, Japan

[21] Appl. No.: 430,270

[22] Filed: Nov. 2, 1989

[30] Foreign Application Priority Data

Nov. 4, 1988 [JP] Japan .................................. 63-279153

[51] Int. Cl.$^5$ ............................................. H05K 3/28
[52] U.S. Cl. .................................................... 29/852
[58] Field of Search ................. 29/852, 853, 829, 842, 29/402.18; 156/901, 902, 645, 656, 666, 668, 94; 427/97, 98, 301, 302, 304, 305, 306, 307; 528/93, 104; 525/113, 504

[56] References Cited

U.S. PATENT DOCUMENTS 4,585,502  4/1986  Uozu et al. ........................ 29/852 X
4,593,069  6/1986  Kamagata et al. .............. 528/104 X

FOREIGN PATENT DOCUMENTS 89591    4/1989   Japan ..................................... 29/852
2017416 10/1979  United Kingdom ................. 29/852

OTHER PUBLICATIONS

J. P. Mitchell et al., of Bell Telephone Laboratories, "Conductive Anodic Filament Growth in Printed Circuit Materials, Printed Circuit World Convention II, '81".

Primary Examiner—Joseph M. Gorski
Assistant Examiner—Peter Dungba Vo

[57] ABSTRACT

A method of manufacturing a printed wiring board includes a step of providing a plurality of pierced holes in prescribed positions of a laminate which is formed by adhering electrolytic conductive metal foils on front and rear surfaces of a laminate mainly composed of resin, a step of dipping the laminate completely provided with the pierced holes in unhardened liquid thermosetting resin, a step of removing excessive parts of the thermosetting resin applied onto the front and rear surfaces of the laminate and inner peripheral walls surfaces of the pierced holes, a step of heating and hardening the applied thermosetting resin, a step of removing parts of the thermosetting resin hardened on the conductive metal foils provided on the front and rear surfaces of the laminate, and a step of forming plating layers of a conductive metal on the front and rear surfaces of the laminate and the inner peripheral wall surfaces of the pierced holes. A printed wiring board having an excellent insulation property between through-holes can be manufactured through the aforementioned steps.

20 Claims, 5 Drawing Sheets

METHOD OF MANUFACTURING PRINTED WIRING BOARD HAVING NO COPPER MIGRATION

BACKGROUND OF THE INVENTION

1. Field of the Invention

The present invention relates to a method of manufacturing a printed wiring board, and more particularly, it relates to a method of manufacturing a double-side copper-clad laminated printed wiring board, which is subjected to high density wiring with a narrow through-hole pitch.

2. Description of the Background Art

In general, a printed wiring board for high density wiring is applied to an office automation apparatus such as a personal computer or a facsimile, or a domestic apparatus such as a video camera or a CD player. In order to improve densification of wiring, a multilayer wiring board has already been generally employed. FIG. 1 illustrates a typical double-side copper-clad laminated printed wiring board 1, which is provided with wiring only on front and rear outer surfaces and having no internal wiring layer. Wires 2a and 2b provided on the front and rear surfaces of this printed wiring board 1 are connected with each other through a through-hole 3.

A method of manufacturing such a printed wiring board of the double-side copper-clad laminated type is now described with reference to a base material prepared from glass fabric base epoxy resin.

FIG. 2 illustrates typical sectional structure of a laminate which is formed by a base material of glass fabric base epoxy resin and copper foils adhered to front and rear surfaces thereof. In this laminate, copper foils 6 are provided on front and rear surfaces of the base material, which is formed by an epoxy resin member 4 and a plurality of glass fabric layers 5 arranged therein. The glass fabric layers 5 are adapted to reinforce the base material, since the glass fabric material has high tensile strength and is excellent in voltage resistance and dielectric properties. Such a copper-clad laminate of glass fabric base epoxy resin is widely applied to a printed wiring board for a general office automation system, a digital audio set and the like.

FIG. 3A is a sectional view showing the double-side copper-clad laminate of glass fabric base epoxy resin, which is provided with pierced holes 7 by perforation.

As shown in FIG. 3B, copper through-hole plating layers 8a are formed on inner peripheral walls of the pierced holes 7, and copper plating layers 8b are formed on the surfaces of the copper foils 6 provided on the front and rear surfaces of the base material. The copper through-hole plating layers 8a and the copper plating layers 8b are generally formed in the following manner: First, the surfaces of the laminate are rinsed or dipped in acid or alkaline chemicals to be cleaned, in the state shown in FIG. 3A. Then, the laminate is subjected to electroless copper plating, rinsing and acid treatment, and further subjected to electrolytic plating, to be provided with the copper through-hole plating layers 8a and the copper plating layers 8b.

After the copper plating layers 8a and 8b are thus formed, the copper plating layers 8b and the copper foils 6 provided on the front and rear surfaces of the base material are etched in prescribed patterns, to attain the state shown in FIG. 3C. The wiring patterns formed on the front and rear surfaces of the base material are connected with each other by through-holes 9, which are defined by the copper through-hole plating layers 8a. The copper plating layers 8b and the copper foils 6 are subjected to pattern etching by a tenting method employing dry photoresist films, for example. The patterns are formed by the tenting method as follows: First, the surfaces of the copper plating layers 8b are subjected to pretreatment of levelling by mechanical polishing with a brush or a buff, soft etching with chemicals or the like. Then, the copper plating surfaces are laminated with photosensitive etching resist films, which in turn are exposed to ultraviolet light through photomasks and thereafter selectively removed by a developing solution. Thereafter, the copper plating layers 8b and the copper foils 6 are selectively removed by an etching solution. Finally the etching resist films are removed by a release solution, to attain the state shown in FIG. 3C.

When a printed wiring board is manufactured by the aforementioned method to be provided with high density wiring patterns with a narrow through-hole pitch, the following problems are caused:

In an initial stage, insulation resistance between through-holes is problematically low. In a long-range view, on the other hand, a problem of copper migration, i.e., movement of copper ions, is caused between the through-holes in response to a voltage load applied across the same, to easily result in current leakage.

Such phenomenons are caused by clearances defined between the glass fabric layers 5 and the epoxy resin member 4 on the inner peripheral wall surfaces of the pierced holes 7 after perforation of the copper-clad laminate.

FIG. 4 typically shows a part of a base material, which is held between two through-holes 9. Referring to FIG. 4, clearances 10 are defined between glass fabric layers 5 and an epoxy resin member 4 in the vicinity of inner peripheral walls of the through-holes 9 of a printed wiring board 1 manufactured by the aforementioned method, and such clearances 10 are filled up with parts of through-hole plating layers 8a. As hereinabove described, the copper plating layers 8a are generally pretreated with acid or alkaline chemicals, which fill up the clearances 10. Since the clearances 10 are extremely fine, the chemicals or plating solutions deeply fill up the clearances 10 through capillarity. It is difficult to completely remove the chemicals or plating solutions thus filling up the clearances 10, even if the printed wiring board 1 is cleaned by rinsing or another method. Thus, insulation resistance between through-holes is reduced in an initial state by the chemicals or plating solutions filling up the clearances 10.

When copper through-hole plating is performed without removing the chemicals or plating solutions filling up the clearances 10, small amounts of ionic substances are charged in the clearances 10, which are sealed by copper plating. Therefore, if voltage is applied across the two through-holes 9, copper migration substances 11 are triggered by the charged ionic substances to gradually extend from the plus side toward the minus side. Consequently, the two through-holes 9 are finally shorted to cause a malfunction in the circuit.

The problem of deterioration in insulation resistance of a printed wiring board caused by copper migration has been reported by, for example, J. P. Mitchells et al. of Bell Telephone Laboratories ("Conductive Anodic Filament Growth in Printed Circuit Materials, Printed Circuit World Convention II, '81", for example). This report discloses deterioration of the insulation property following generation of the so-called CAF (conductive anodic filaments) caused by growth of copper ions between through-holes of a printed wiring board of glass fabric base epoxy resin. This literature also reports an acceleration test made under a high temperature, high humidity and high voltage as means for evaluating the insulation property of a printed wiring board.

Such copper migration is a problematic phenomenon which may occur between copper electrodes provided on a substrate surface as an electronic circuit of a printed wiring board is highly densified and the distance between electrode terminals is extremely reduced. FIG. 5 shows the mechanism of copper migration occurring on a substrate surface. The above literature explains this mechanism as follows:

Consider that a water droplet 15 is in contact with an anode-side copper electrode 13 and a cathode-side copper electrode 14, which are provided on a substrate surface 12. First, the anode-side copper electrode 13 ionizes upon contact with the water droplet 15, to liberate cations of copper. The cations migrate toward the cathode side due to potential difference, while receiving a negative load from the copper electrode 14 to react as follows:

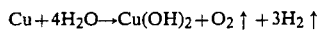

$$Cu + 4H_2O \rightarrow Cu(OH)_2 + O_2 \uparrow + 3H_2 \uparrow$$

In this case, $Cu(OH)_2$ and $O_2$ gas are generated in the vicinity of the anode-side copper electrode 13, while $H_2$ gas is generated in the vicinity of the cathode-side copper electrode 14. Further, $Cu(OH)_2$ generated in the vicinity of the copper electrode 14 partially reacts as follows:

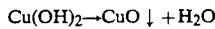

$$Cu(OH)_2 \rightarrow CuO \downarrow + H_2O$$

CuO thus generated forms dendrite crystals called dendrites, which precipitate on the substrate surface 12 from the copper electrode 14 toward the copper electrode 13 to grow. When the CuO dendrites grow to cause a short across the copper electrodes 13 and 14, a malfunction takes place in the electronic circuit.

Such migration in a printed wiring board, generically named electromigration, occurs not only in copper electrodes but in other types of metal electrodes such as silver electrodes.

In order to prevent such electromigration on the surface of a printed wiring board, means of previously coating the surface with a resin film has already been carried out to attain an effect of preventing deterioration of surface insulation resistance.

However, the aforementioned copper migration occurring between through-holes is a phenomenon caused in clearances which are filled up with parts of copper through-hole plating layers. Therefore, it is impossible to prevent such copper migration by coating performed after copper plating, dissimilarly to the above case of migration occurring on the substrate surface.

Thus, a countermeasure for preventing some copper migration occurring in the process of manufacturing a printed wiring board has been awaited.

The phenomenon of migration caused between through-holes is not restricted to the copper migration in the case of copper through hole plating, but also occurs when through-holes are provided by coating of another type of conductive paint such as silver.

SUMMARY OF THE INVENTION

The present invention has been proposed to solve the aforementioned problems, and an object thereof is to provide a method of manufacturing a printed wiring board, which prevents chemicals or plating solutions from filling up clearances defined in a base material by perforation for forming through-holes, thereby to prevent migration of metal ions between the through-holes so that insulation resistance is not deteriorated.

A further object of the present invention is to prevent occurrence of copper migration between through-holes in a printed wiring board which is subjected to high-density wiring with narrow through-hole pitches.

Copper migration between through-holes occurs due to connection of glass fiber of glass fabric contained in a laminate base material between through-holes.

The main feature of the present invention is that clearances define between glass fabric and resin in through-holes are filled up with thermosetting resin through capillarity in order to prevent the above-mentioned copper migration.

According to the inventive method of manufacturing a printed wiring board, pierced holes are provided in prescribed positions of a laminate, which is formed by adhering electrolytic conductive metal foils onto front and rear surfaces of a laminated base material mainly composed of resin. Then resin layers are formed on inner peripheral wall surfaces of the pierced holes, and thereafter conductive metal layers are formed on the front and rear surfaces of the laminate and the resin layers provided on the inner peripheral wall surfaces of the pierced holes.

In another aspect of the present invention, the method of manufacturing a printed wiring board comprises a step of applying unhardened liquid thermosetting resin onto front and rear surfaces of a laminate and inner peripheral wall surfaces of pierced holes provided in the laminate, a step of heating and hardening the thermosetting resin thus applied, a step of removing parts of the thermosetting resin hardened on conductive metal foils provided on the front and rear surfaces of the laminate, and a step of forming conductive metal layers on the front and rear surfaces of the laminate and the inner peripheral walls of the pierced holes.

According to a preferred embodiment of the inventive method of manufacturing a printed wiring board, a laminated base material is prepared from glass fabric base epoxy resin, glass fabric base polyimide resin, glass fabric base bismaleimide triazine resin, or paper base phenolic resin.

The laminate is preferably formed by adhering copper foils onto front and rear surfaces of a laminated base material.

The thermosetting resin is prepared by dissolving epoxy resin, a hardening agent and a hardening accelerator in a solvent and mixing the same with each other, so that a nonvolatile component contained therein is not more than 25 percent by weight.

According to the present invention, the inner peripheral wall surfaces of the pierced holes are sealed with the thermosetting resin before formation of through-hole plating layers, to thereby to prevent metal migration between through-holes. Thus, the insulation property of the printed wiring board is extremely improved.

These and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention is now described with reference through FIGS. 6A to 6C, 7A and 7B.

Figure 1:
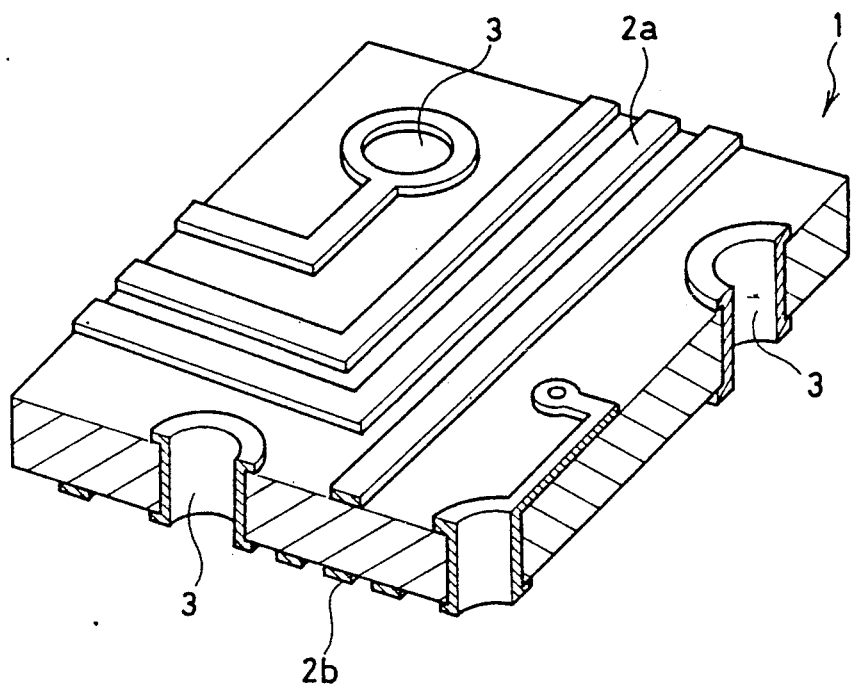
FIG. 1 is a partially fragmented perspective view showing a conventional printed wiring board which is formed by a general double-side copper-clad laminate.
Figure 2:
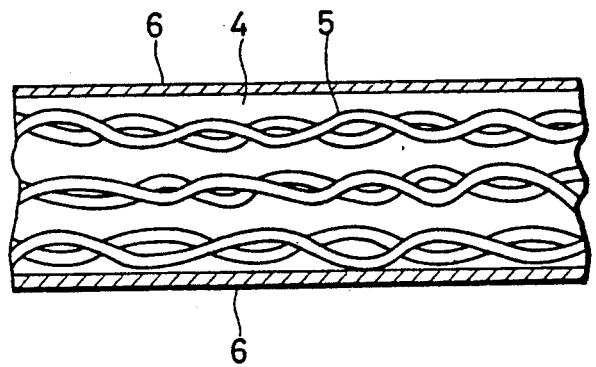
FIG. 2 is a sectional view showing a double-side copper-clad laminate of glass fabric base epoxy resin.
Figure 3A:
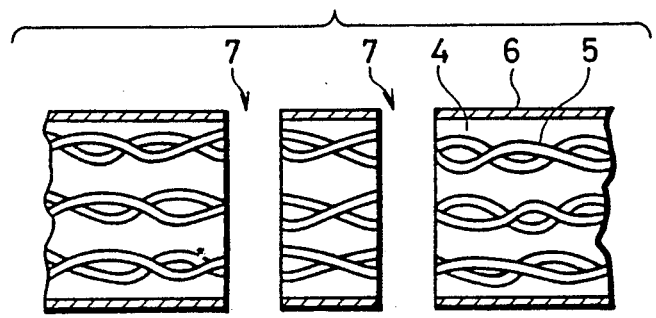
FIGS. 3A to 3C illustrate steps of manufacturing a printed wiring board including through-holes by employing a double-side copper-clad laminate of glass fabric base epoxy resin by a conventional method.
Figure 3B:
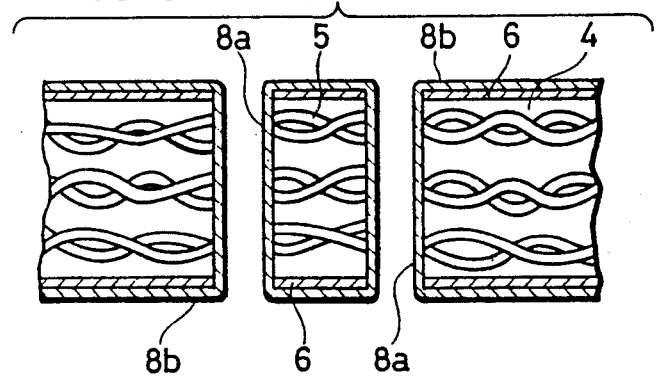
Figure 3C:
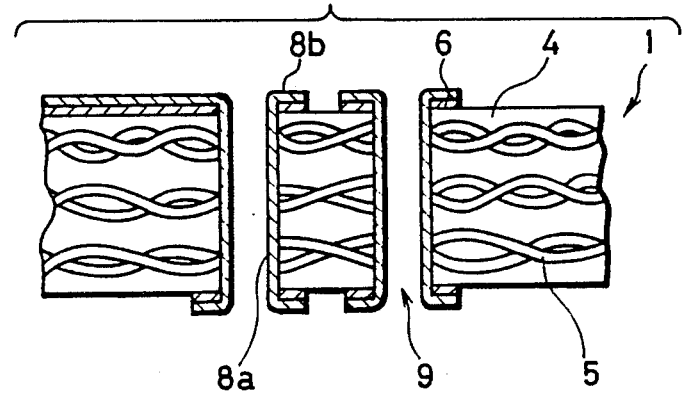
Figure 4:
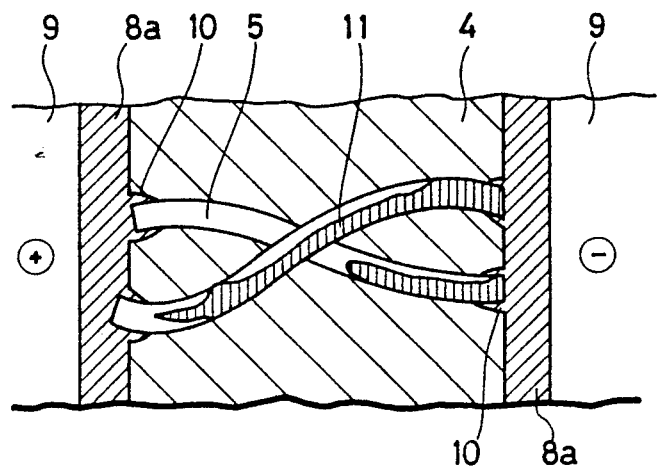
FIG. 4 is a sectional view for illustrating the state of copper migration caused in clearances between glass fabric layers and an epoxy resin member.
Figure 5:
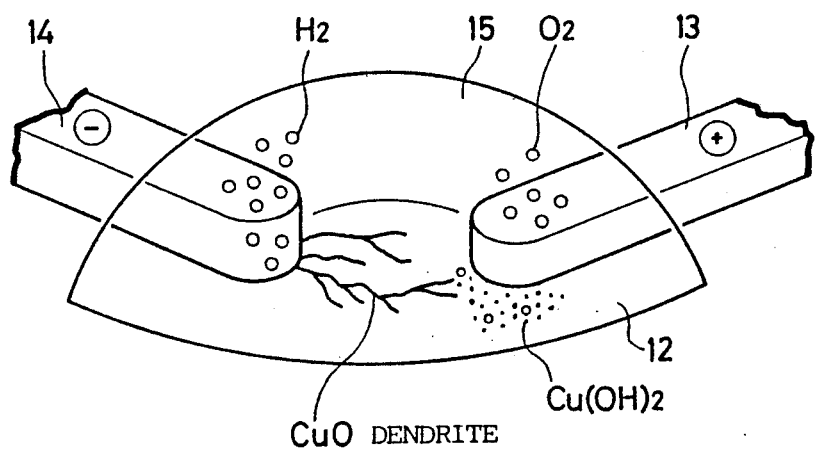
FIG. 5 is an explanatory diagram showing the mechanism of copper migration occurring on the surface of a printed wiring board.

First, perforation for forming through-holes is performed in prescribed positions of a laminate which is formed by adhering copper foils 6 of 18 to 35 $\mu$m in thickness onto front and rear surfaces of a base material of glass fabric base epoxy resin having the structure shown in FIG. 2. The perforation step can be carried out with a general drill, in a wide range of diameters of about 0.3 to 6 mm in response to thickness of about 1 to several millimeters of the laminate and the intended use of the printed wiring board. The main spindle of the drill is rotated at a speed of 15 to 80 krpm.

A multi-spindle unit simultaneously driving a plurality of drills is employed for mass production in response to the throughput, while a four-spindle type unit is used in general.

Figure 6A:
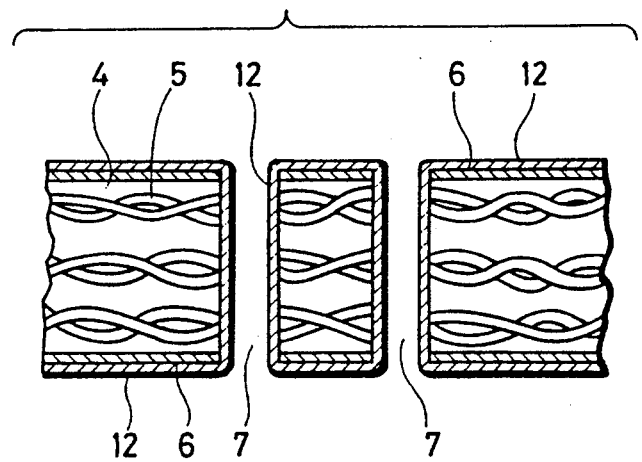
FIGS. 6A to 6C are sectional views showing steps of a method of manufacturing a printed wiring board according to an embodiment of the present invention.

After pierced holes 7 are provided by the perforation step, the laminate is dipped in liquid thermosetting resin under an ordinary temperature. Then, excessive parts of the thermosetting resin solution are removed from the surfaces of the laminate and inner peripheral wall surfaces of the pierced holes 7 by a high pressure air squeegee or the like, which is adapted to blow off the excessive parts by injecting air. Consequently, coating films 12 of the thermosetting resin are formed on the copper foils 6 provided on the surfaces of the laminate and the inner peripheral wall surfaces of the pierced holes 7, as shown in FIG. 6A.

The thermosetting resin employed for forming the coating films 12 is prepared as follows, for example: First, epoxy resin, a hardening agent and a hardening accelerator are respectively dissolved in a solvent and completely mixed with each other. An example of a basic combination is 100 parts of epoxy resin prepared from Epikote 1001 (trade name: product of Shell Chemical Co.), 4 parts of a hardening agent prepared from dicyandiamide (DICY), 0.2 parts of a hardening accelerator prepared from BDMA (benzildimethylamine), and about 100 parts of a solvent prepared from methyl oxytol (glycolic monoalkyl ether). The solvent is further added to the basic combination, in order to adjust the weight percentage of the so-called nonvolatile component. The term "nonvolatile component" used herein indicates a mixture of components other than the solvent, i.e., the epoxy resin, the hardening agent, the hardening accelerator and other loading material.

Such adjustment of the nonvolatile component is important in view of manufacturing. If the content of the nonvolatile component is excessive, it is difficult to remove parts of the thermosetting resin from the surfaces of the copper foils 6 in a later step. The laminate is dipped in the thermosetting resin for an essential object of impregnating clearances defined between glass fabric layers 5 and an epoxy resin member 4 with the thermosetting resin. In order to impregnate the clearances with the thermosetting resin, it is necessary to prompt capillarity, i.e., to reduce viscosity of the thermosetting resin. The content of the nonvolatile component is preferably not more than about 25 percent by weight, so that viscosity of the thermosetting resin is sufficiently reduced to cause capillarity.

The coating films 12 thus formed are heated at a temperature of 120° to 150° C. for 30 minutes to two hours, to be completely hardened. In this state, the clearances defined between the glass fabric layers 5 and the epoxy resin member 4 in the perforation step are filled up with the thermosetting resin.

Figure 6B:
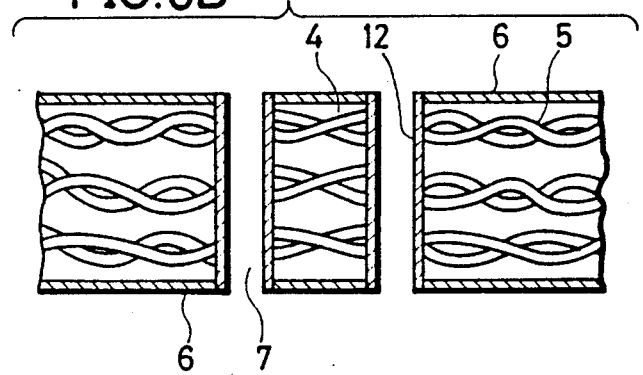
Figure 6C:
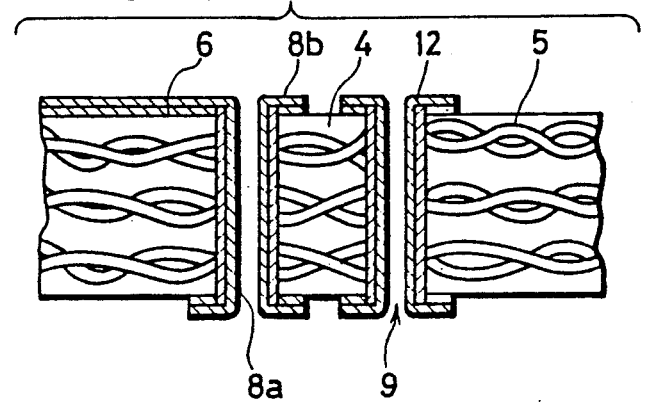

Then, the coating films 12 formed on the copper foils 6 provided on the surfaces of the laminate are removed by buffing and the laminate is rinsed, to attain the state shown in FIG. 6B.

Thereafter the laminate is subjected to electroless copper plating, rinsing and acid treatment, and further subjected to electrolytic copper plating.

Copper through-hole plating layers 8a and copper plating layers 8b are formed as the result. Thereafter, the copper plating layers 8b and the copper foils 6 provided on the front and rear surfaces of the base material are etched in prescribed patterns, to attain the state shown in FIG. 6C. The copper plating layers 8b and the copper foils 6 are subjected to pattern etching by a method similar to that in the prior art, such as the tenting method, for example.

Figure 7A:
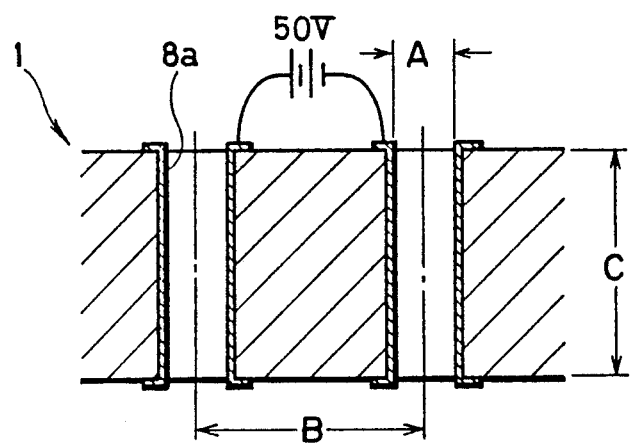
FIG. 7A illustrates the sectional configuration of a printed wiring board employed for evaluating the insulation property in the embodiment of the present invention.

In order to prove the effect of this embodiment, an acceleration test was made with application of high voltage under a high temperature and high humidity to measure time changes of insulation resistance values between through-holes as to the case of a sample prepared from thermosetting resin containing 25 percent by weight of a nonvolatile component and a reference sample prepared according to the prior art with no application of thermosetting resin. Conditions of the acceleration test were a temperature of 60° C., humidity of 95 % and applied voltage of 50 V (DC). FIG. 7A shows the sectional structure of each printed wiring board employed in the acceleration test wherein a plated through-hole A is approximately 0.4mm in diameter and a distance B between adjacent through-holes as measured from a longitudinal axis thereof is approximately 1.0mm, and FIG. 7B is a graph showing results of the evaluation.

Figure 7B:
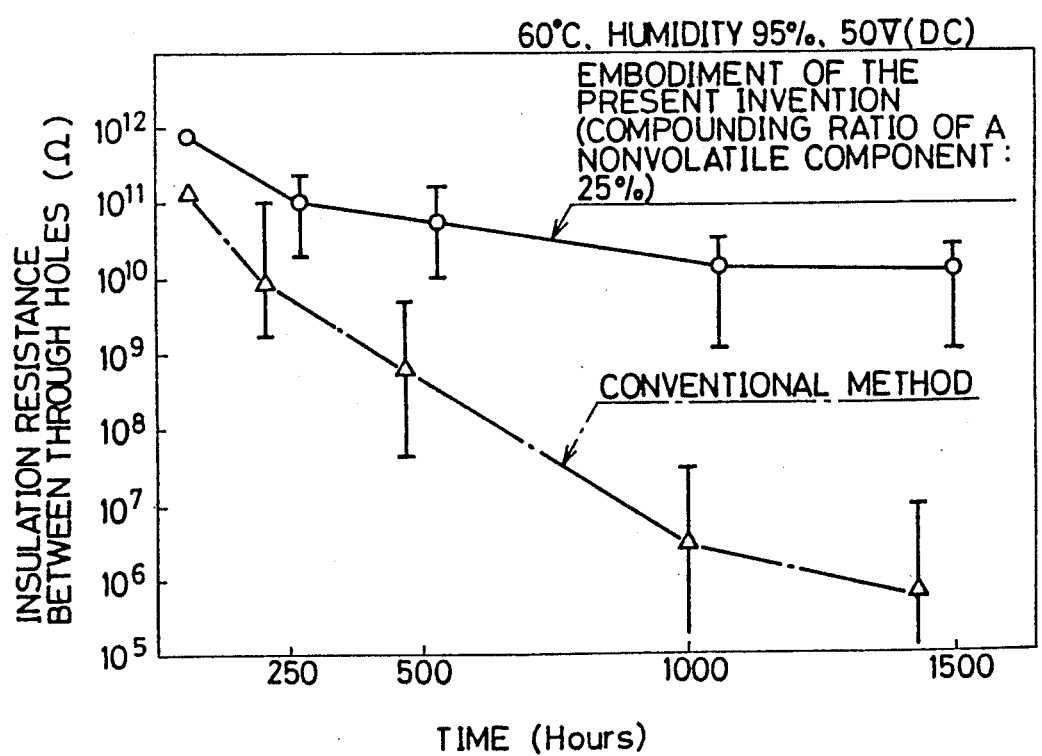
FIG. 7B is a graph showing the results of the evaluation.

In the graph shown in FIG. 7B, elapsed times of the acceleration test are plotted on the horizontal line and insulation resistance values between adjacent through-holes are plotted on the vertical line. According to this graph, deterioration of insulation resistance is extremely suppressed in this embodiment as compared with the prior art. Thus, it is understood that the insulation property is extremely improved in this embodiment as compared with the prior art.

Although the base material for the printed wiring board is prepared from glass fabric base epoxy resin in the above embodiment, the present invention is also applicable to a base material prepared from glass fabric base polyimide resin, glass fabric base bismaleimide triazine resin, paper base phenolic resin, or the like. When glass fabric base polyimide resin or glass fabric base bismaleimide triazine resin is employed, copper migration is effectively prevented by application of this embodiment in clearances defined between glass fabric layers and a resin layer. On the other hand, a laminate of paper base phenolic resin is formed by drying a paper base material impregnated with unhardened phenolic resin, cutting the same in prescribed dimensions, overlapping a prescribed number of such materials, and heating and pressurizing the same to form a sheet. When such a base material is provided with through-holes in accordance with the prior art, copper migration occurs in clearances defined between layers of the laminated base material. However, such a problem can be solved by the present invention since the clearances defined between the layers are filled up before formation of through-holes. Such a copper-clad laminate prepared from paper base phenolic resin has been widely applied to a domestic apparatus such as a television, a VTR or the like, since it is easy to stamp component insertion holes by dies.

In the aforementioned embodiment, the thermosetting resin to be applied is prepared from epoxy resin in correspondence to the base material which is prepared from glass fabric base epoxy resin. However, it is not necessarily required to prepare the resin to be applied from the same material as the base material, but the thermosetting resin can be prepared with no problem from a material which is easily liquefied into a solution of low viscosity under the ordinary temperature and excellent in copper plating resistance and solder dip resistance.

Further, the present invention is widely applicable not only to the case involving the problem of copper migration but to the case involving a problem of silver migration caused in relation to through-holes formed by silver plating or the like, to thereby prevent electromigration in a wide range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a printed wiring board, comprising:
   a step of providing a plurality of pierced holes in prescribed positions of a laminate formed by adhering electrolytic conductive metal foils onto front and rear surfaces of a plate-type laminated base material mainly composed of resin, one of said resin layers including a laminated resin base material having glass fabric as a reinforcing material, and wherein glass fiber of the glass fabric is connected between adjacent ones of said plurality of pierced holes;
   a step of forming resin layers on inner peripheral wall surfaces of said pierced holes including a step of applying unhardened liquid thermosetting resin;
   a step of impregnating clearances defined between the glass fabric and the resin with the thermosetting resin from the inner peripheral wall surfaces of said pierced holes through capillarity, thereby filling the clearance and preventing copper migration between said pierced holes; and
   a step of forming conductive metal layers on said front and rear surfaces of said laminate and said resin layers provided on said inner peripheral wall surfaces if said pierced holes.

2. A method of manufacturing a printed wiring board in accordance with claim 1, wherein said laminated base material is prepared from glass fabric base epoxy resin, glass fabric base polyimide resin, glass fabric base bismaleimide triazine resin, or paper base phenolic resin, 3. A method of manufacturing a printed wiring board in accordance with claim 1, wherein a laminate formed by adhering copper foils onto front and rear surfaces of a laminated base material is employed.

4. A method of manufacturing a printed wiring board, comprising:
   a step of providing a plurality of pierced holes in prescribed positions of a laminate formed buy adhering electrolytic conductive metal foils onto front and rear surfaces of a plate-type laminated base material mainly composed of resin, said resin as a laminated base material including glass fabric as a reinforcing material and wherein glass fiber of the glass fabric is connected between adjacent ones of said plurality of pierced holes;
   a step of applying unhardened liquid thermosetting resin onto said front and rear surfaces of said laminate and inner peripheral wall surfaces of said pierced holes;
   a step of impregnating clearances defined between the glass fabric and the resin with thermosetting resin from the inner peripheral wall surfaces of said pierced holes through capillarity thereby filling the clearance and preventing copper migration between said pierced holes;
   a step of heating and hardening said applied thermosetting resin;
   a step of removing parts of said thermosetting resin hardened on said conductive metal foils provided on said front and rear surfaces of said laminate; and
   a step of forming conductive metal layers on said front and rear surfaces of said laminate and said inner peripheral wall surfaces of said pierced holes.

5. A method of manufacturing a printed wiring board in accordance with claim 4, wherein said laminate is prepared from glass fabric base epoxy resin, glass fabric base polyimide resin, glass fabric base bismaleimide triazine resin or paper base phenolic resin.

6. A method of manufacturing a printed wiring board in accordance with claim 4, wherein a laminate formed by adhering copper foils onto front and rear surfaces of a laminate is employed.

7. A method of manufacturing a printed wiring board in accordance with claim 4, wherein said thermosetting resin is prepared by dissolving epoxy resin, a hardening agent and a hardening accelerator in a solvent respectively and mixing the same with each other.

8. A method of manufacturing a printed wiring board in accordance with claim 4, further comprising the step of adjusting a compounding ratio of a nonvolatile component contained in said thermosetting resin thereby effectively adjusting viscosity thereof.

9. A method of manufacturing a printed wiring board in accordance with claim 8, wherein the step of adjusting compounding ratio of said nonvolatile component contained in said thermosetting resin is not more than 25 percent by weight.

10. A method of manufacturing a printed wiring board in accordance with claim 4, wherein said step of removing said parts of said thermosetting resin hardened on said conductive metal foils provided on said front and rear surfaces of said laminate is carried out by buffing and rinsing said parts of said thermosetting resin hardened on said conductive metal foils.

11. A method of manufacturing a printed wiring board in accordance with claim 4, wherein said step of forming said conductive metal layers on said front and rear surfaces of said laminate and said inner peripheral wall surfaces of said pierced holes is carried out by performing electroless copper plating and electrolytic copper plating on said laminate to form copper plating layers.

12. A method of manufacturing a printed wiring board in accordance with claim 4, wherein said step of applying said unhardened liquid thermosetting resin onto said front and rear surfaces of said laminate and said inner peripheral wall surfaces of said pierced holes includes:
  a step of dipping said laminate completely provided with said pierced holes in said unhardened liquid thermosetting resin, and
  a step of removing excessive parts of said thermosetting resin applied onto said front and rear surfaces of said laminate and said inner peripheral wall surfaces of said pierced holes.

13. A method of manufacturing a printed wiring board in accordance with claim 4, wherein said thermosetting resin is prepared by dissolving epoxy resin, a hardening agent and a hardening accelerator in a solvent respectively and mixing the same with each other.

14. A method of manufacturing a printed wiring board in accordance with claim 4, further comprising the step of adjusting a compounding ratio of nonvolatile component contained in said thermosetting resin thereby effectively adjusting viscosity thereof.

15. A method of manufacturing a printed wiring board in accordance with claim 14, wherein the step of adjusting compounding ratio of said nonvolatile component contained in said thermosetting resin is not more than 25 percent by weight.

16. A method of manufacturing a printed wiring board in accordance with claim 4, wherein excessive parts of applied said thermosetting resin are removed by a high pressure air squeegee.

17. A method of manufacturing a printed wiring board in accordance with claim 4, wherein said step of removing said parts of said thermosetting resin hardened on said conductive metal foils provided on said front and rear surfaces of said laminate is carried out by buffing and rinsing said parts of said thermosetting resin hardened on said conductive metal foils.

18. A method of manufacturing a printed wiring board in accordance with claim 4, wherein said step of forming said conductive metal layers on said front and rear surfaces of said laminate and said inner peripheral wall surfaces of said pierced holes is carried out by performing electroless copper plating and electrolytic copper plating on said laminate to form copper plating layers.

19. A method of manufacturing a printed wiring board, comprising:
  a step of providing a plurality of pierced holes in prescribed positions of a laminate formed by adhering copper foils onto front and rear surfaces of a plate-type laminated base material composed of a glass fabric base epoxy resin, wherein glass fiber of the glass fabric base is connected between adjacent ones of said plurality of pierced holes;
  a step of dipping said laminate completely provided with pierced holes in liquid thermosetting resin prepared by dissolving epoxy resin, a hardening agent and a hardening accelerator in a solvent;
  a step of impregnating clearances defined between the glass fabric and the resin with the thermosetting resin from the inner peripheral wall surfaces of said pierced holes through capillarity, thereby filling the clearances and preventing copper migration between said pierced holes;
  a step of removing excessive parts of said thermosetting resin applied onto said front and rear surfaces of said laminate and inner peripheral wall surfaces of said pierced holes;
  a step of heating and hardening said applied thermosetting resin;
  a step of removing parts of said thermosetting resin hardened on said copper foils provided on said front and rear surfaces of said laminate by buffing and rinsing the same; and
  a step of performing electroless copper plating and electrolytic copper plating on said front and rear surfaces of said laminate and said inner peripheral wall surfaces of said pierced holes to form copper plating layers.

20. A method of manufacturing a printed wiring board in accordance with claim 19, further comprising the step of adjusting a compounding ratio of a nonvolatile component contained in said thermosetting resin by not more than 25 percent by weight.

* * * * *